United States Patent [19]

Miyagoshi et al.

[11] Patent Number: 5,604,499
[45] Date of Patent: Feb. 18, 1997

[54] VARIABLE-LENGTH DECODING APPARATUS

[75] Inventors: Eiji Miyagoshi; Hiroshi Imanishi, both of Osaka; Hiroshi Takeno, Kyoto, all of Japan

[73] Assignee: Matsushita Electric Industrial Co., Ltd., Osaka, Japan

[21] Appl. No.: 358,597

[22] Filed: Dec. 14, 1994

[30] Foreign Application Priority Data

Dec. 28, 1993 [JP] Japan ..................... 5-337280

[51] Int. Cl.$^6$ ........................ H03M 7/40
[52] U.S. Cl. ........................ 341/67
[58] Field of Search ............ 341/67, 55, 63, 341/65, 106

[56] References Cited

U.S. PATENT DOCUMENTS 4,899,149  2/1990  Kahan .

5,404,138  4/1995  Kim et al. ..................... 341/67

*Primary Examiner*—Brian K. Young
*Attorney, Agent, or Firm*—McDermott, Will & Emery

[57] ABSTRACT

A prefix data generating portion is arranged such that a bit string having bits in predetermined number supplied from a barrel shifter is compared, from the head part thereof, with predetermined patterns and that there is supplied a less-bit bank address assigned to the identical predetermined pattern. In a look-up table, a decoded data is addressed using (i) an upper address of the bank address and (ii) a lower address of a plurality of remaining bits of the code, other than the predetermined pattern. Accordingly, the look-up table can be addressed with an address in which the number of bits is smaller than that of the code. This reduces the look-up table in capacity, enabling to provide a variable-length decoding apparatus reduced in hardware size.

15 Claims, 9 Drawing Sheets

TABLE ACCORDING TO THE PRESENT INVENTION

| ADDRESS | | DATA | |
|---|---|---|---|
| BANK ADRESS | CODE IMMEDIATELY AFTER PREFIX PATTERN | CODE LENGTH | CODE |
| 000 | 00 | 2 | 1 |
| 000 | 01 | THE SAME AS ABOVE | |
| 000 | 10 | 2 | 2 |
| 000 | 11 | THE SAME AS ABOVE | |
| 001 | 00 | 2 | 3 |
| 001 | 01 | 2 | 4 |
| 001 | 10 | THE SAME AS ABOVE | |
| 001 | 11 | THE SAME AS ABOVE | |
| 010 | 00 | 2 | 5 |
| 010 | 01 | THE SAME AS ABOVE | |
| 010 | 10 | 2 | 6 |
| 010 | 11 | THE SAME AS ABOVE | |
| 011 | 00 | 2 | 7 |
| 011 | 01 | THE SAME AS ABOVE | |
| 011 | 10 | 2 | 8 |
| 011 | 11 | THE SAME AS ABOVE | |
| 100 | 00 | 2 | 9 |
| 100 | 01 | 2 | 10 |
| 100 | 10 | THE SAME AS ABOVE | |
| 100 | 11 | THE SAME AS ABOVE | |
| 101 | 00 | 2 | 11 |
| 101 | 01 | THE SAME AS ABOVE | |
| 101 | 10 | THE SAME AS ABOVE | |
| 101 | 11 | 2 | 12 |
| 110 | 00 | THE SAME AS ABOVE | |
| 110 | 01 | THE SAME AS ABOVE | |
| 110 | 10 | 2 | 13 |
| 110 | 11 | 2 | 14 |
| 111 | 00 | 2 | 15 |
| 111 | 01 | 2 | 15 |
| 111 | 10 | THE SAME AS ABOVE | |
| 111 | 11 | THE SAME AS ABOVE | |

Fig.6

TABLE OF PRIOR ART

| TABLE ADDRESS | DATA | |
|---|---|---|
| | CODE LENGTH | CODE |
| 0000000000 ~ 0000000001 | UNUSED | |
| 0000000010 ~ 0000000011 | 10 | 15 |
| 0000000101 | THE SAME AS ABOVE | |
| 0000000110 | 10 | 14 |
| 0000000111 | 10 | 13 |
| 0000001000 ~ 0000001001 | 9 | 11 |
| 0000001010 ~ 0000001101 | THE SAME AS ABOVE | |
| 0000001110 0000001111 | 9 | 12 |
| 0000010000 ~ 0000010011 | 8 | 9 |
| 0000010100 ~ 0000010111 | 8 | 10 |
| 0000011000 ~ 0000011111 | THE SAME AS ABOVE | |
| 0000100000 ~ 0000100111 | 7 | 7 |
| 0000101000 ~ 0000101111 | THE SAME AS ABOVE | |
| 0000110000 ~ 0000110111 | 7 | 8 |
| 0000111000 ~ 0000111111 | THE SAME AS ABOVE | |
| 0001000000 ~ 0001001111 | 6 | 5 |
| 0001010000 ~ 0001011111 | THE SAME AS ABOVE | |
| 0001100000 ~ 0001101111 | 6 | 6 |
| 0001110000 ~ 0001111111 | THE SAME AS ABOVE | |
| 0010000000 ~ 0010011111 | 5 | 3 |
| 0010100000 ~ 0010111111 | 5 | 4 |
| 0011000000 ~ 0011111111 | THE SAME AS ABOVE | |
| 0100000000 ~ 0100111111 | 4 | 1 |
| 0101000000 ~ 0101111111 | THE SAME AS ABOVE | |
| 0110000000 ~ 0110111111 | 4 | 2 |
| 0111111111 ~ 1111111111 | THE SAME AS ABOVE | |

VARIABLE-LENGTH DECODING APPARATUS

BACKGROUND OF THE INVENTION

1. Field of the Invention

The present invention relates to improvements in a variable-length decoding apparatus, and more particularly to a variable-length decoding apparatus reduced in capacity of a look-up table by storing a large number of decoded data with high storage density.

2. Description of the Prior Art

Variable-length decoding is very effective in a reduction in storage density and therefore often used for reproduction of compressed image data with the use of any of a variety of algorithms in recent years. According to the variable-length decoding, the more frequently occurring data out of a variety of types of data is converted into the shorter-length code-data, thus reducing the total bit amount in which all the bits of a large number of data are totalled.

The following description will discuss a conventional variable-length decoding apparatus.

Figure 9:
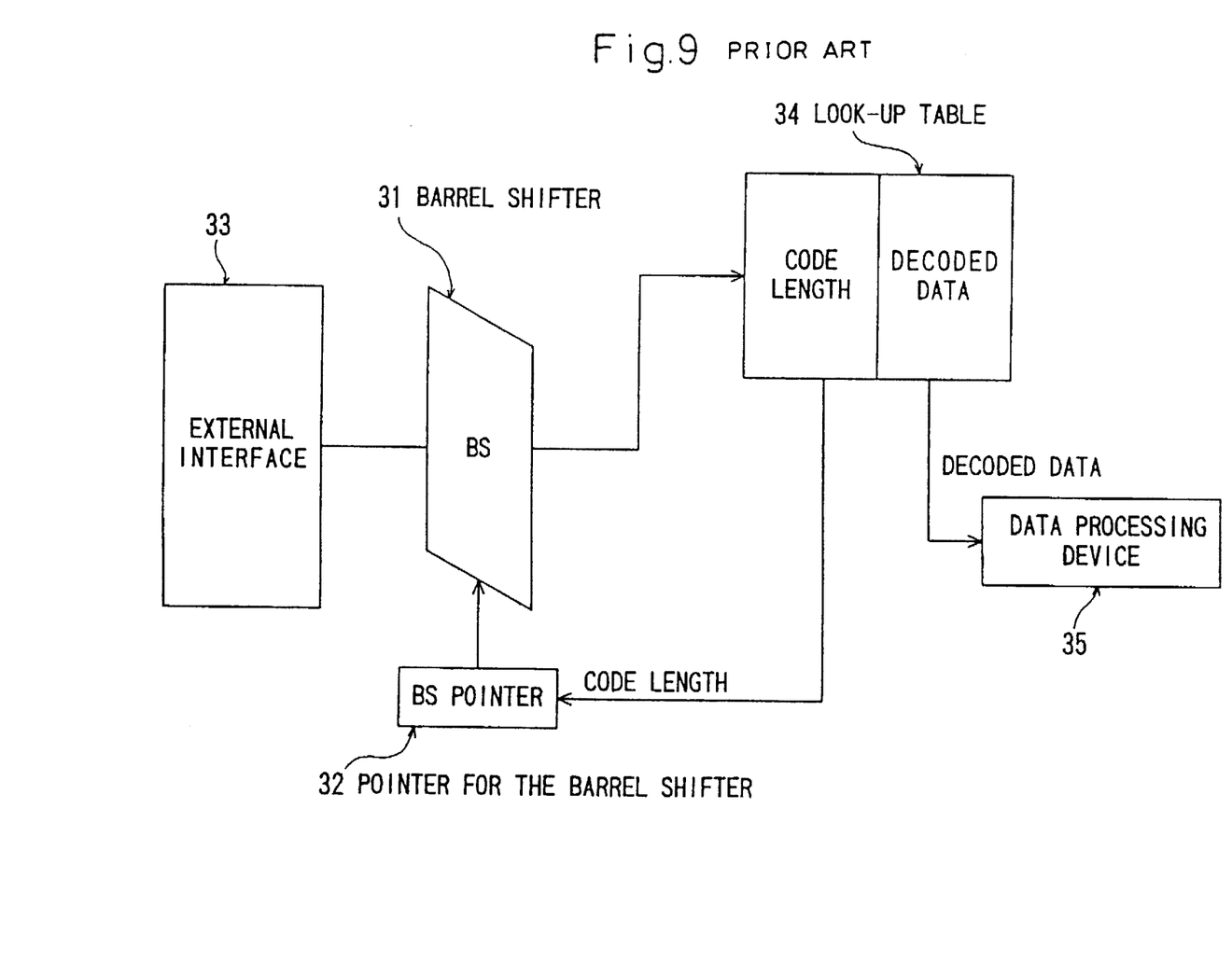
FIG. 9 is a block diagram of a variable-length decoding apparatus of prior art.

FIG. 9 is a block diagram of a conventional variable-length decoding apparatus. Shown in FIG. 9 are a barrel shifter 31, a pointer 32 for the barrel shifter 31, an external interface 33 into which a bit string containing a plurality of codes in a continuous manner is externally entered, a look-up table 34, and a data processing device 35 for processing a decoded data. As shown in FIG. 9, each data format in the look-up table 34 comprises the number of bits (code length) of a code and a decoded data.

A bit string entered through the external interface 33, is entered into the barrel shifter 31. The barrel shifter 31 supplies, out of the bit string thus entered, a bit string having bits in predetermined number (more specifically, a bit string having the code length of the variable-length code having the maximum code length). The bit string thus supplied, serves as an address value for the look-up table 34, and the decoded data stored at this address value is taken out from the look-up table 34. This decoded data is entered into the data processing device 35, which executes a decoded-data processing and other processing than the decoded-data processing. Also, with the bit string from the barrel shifter 31 serving as an address, the look-up table 34 supplies a signal representing the code length of a code subjected to decoding. This code-length signal is entered into the pointer 32. Upon reception of an instruction from the pointer 32, the barrel shifter 31 shifts the bit string by the code length represented by the code-length signal. This results in exclusion of the decoded code, and the next code is positioned at the head of a bit string having bits in predetermined number which is to be supplied at the next time from the barrel shifter 31.

Recently, it is desired to execute a processing on image data or the like using high frequency to increase the processing speed. In order to shorten the time required for reading a data from the look-up table, it is proposed to dispose, within a chip, a look-up table forming memory, instead of external attachment thereof.

In the arrangement of prior art, however, the look-up table is large in hardware size. This increases the memory in size, resulting in a failure to dispose the memory within the chip for faster processing.

The following description will discuss in detail the defect that the look-up table of prior art is large in hardware size.

For example, when the maximum code length of variable-length codes is 10 bits, there is required a look-up table of

Figure 6:
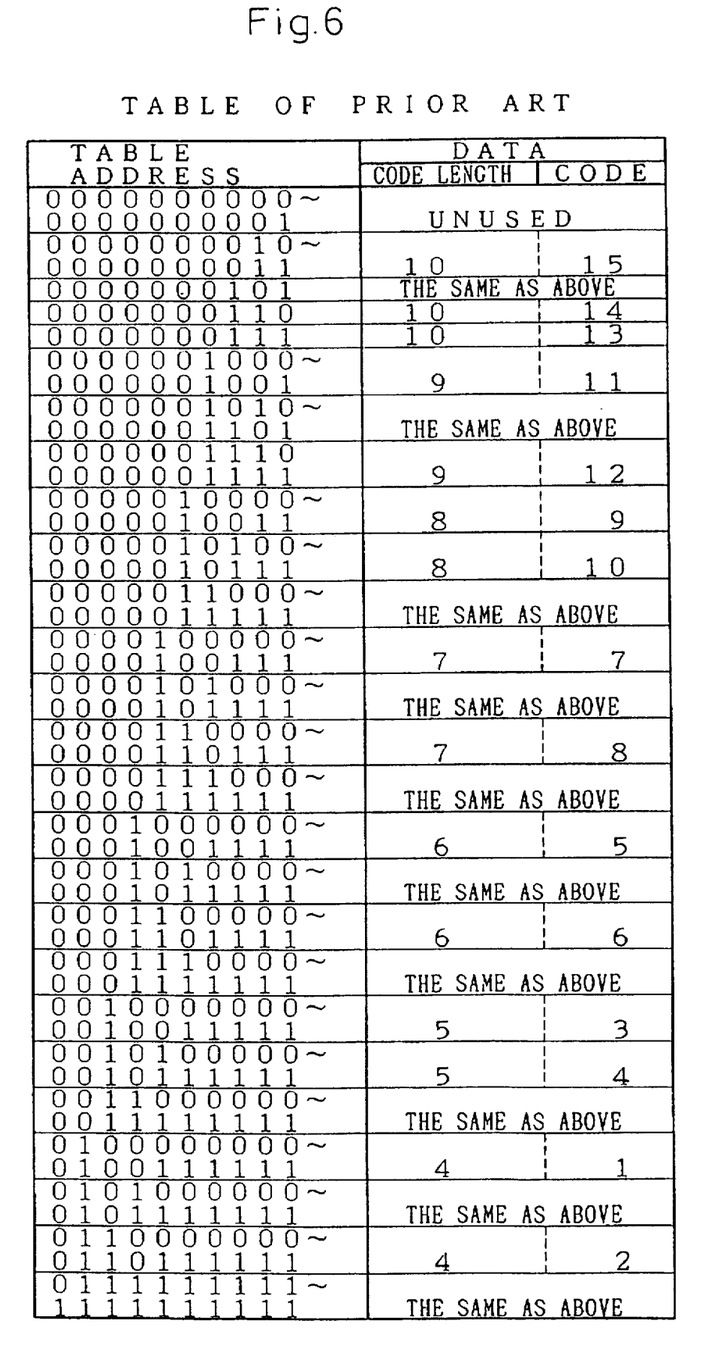
FIG. 6 shows a look-up table of prior art.

2 capacity as large as $2^{10}$ words. However, the barrel shifter always supplies a bit string having bits in predetermined number (e.g., 10 bits), which is entered into the look-up table. Accordingly, as shown in FIG. 6, for example as to the code [0010] of which code length is [4] and the code [0011] approximate thereto, it is required to store the decoded data for the code [0010] in the table areas in the look-up table between the 10-bit address [0010xxxxxx] (in which [xxxxxx] refers to an arbitrary bit string having six bits following on ([0010]) and the 10-bit address [0011000000]. Accordingly, the look-up table of prior art is low in the storage density of a large number of decoded data. As a result, when the number of the types of variable-length codes is large to lengthen the code length of the variable-length codes, the look-up table is further increased in storage capacity. This disadvantageously increases the look-up table in hardware size.

APPLICATION OF THE DISCLOSURE

It is an object of the present invention to provide a variable-length decoding apparatus having a small-capacity look-up table reduced in hardware size, yet storing a large number of decoded data as done in a look-up table of prior art.

To achieve the object above-mentioned, the present invention is arranged such that a bit string forming each of a large number of variable-length codes, is divided into a plurality of groups, and a plurality of bits in each group are converted into a predetermined less-bit bank address corresponding to the bits above-mentioned, and the look-up table is addressed with this bank address and the remaining part (other group) of the code.

A variable-length decoding apparatus according to the present invention comprises:

a barrel shifter for shifting continuous variable-length codes by the predetermined number of bits;

a prefix data generating portion previously containing (i) a plurality of predetermined patterns each having a predetermined code length comprising a plurality of bits and (ii) a plurality of bank addresses in each of which the number of bits is smaller than the code length of any of the predetermined patterns and which are respectively assigned to the predetermined patterns, the prefix data generating portion being arranged such that each variable-length code supplied from the barrel shifter is compared, from the head part thereof, with the plurality of predetermined patterns and that the bank address of the identical predetermined pattern is supplied; and a look-up table previously containing a large number of decoded data obtained by decoding a large number of variable-length codes, the look-up table being arranged such that, using, as an address, (i) the address supplied by the prefix data generating portion and (ii) the remaining part of the variable-length code supplied from the barrel shifter, other than the predetermined pattern, there is supplied the decoded data corresponding to the variable-length code supplied from the barrel shifter.

In the variable-length decoding apparatus according to the present invention, there are further disposed a pointer for instructing, to the barrel shifter, the predetermined number of bits to be shifted; and a code length selecting circuit;

the prefix data generating portion being so arranged as to generate a coincidence signal representing that the head part of a code including bits in predetermined number, is identical with a predetermined pattern, and as to supply a code length signal representing the code length of the identical predetermined pattern, the look-up table being so arranged as to supply a signal representing the code length obtained by subtracting the code length of the identical predetermined pattern, from the code length of a variable-length code to be decoded, the code length selecting circuit being arranged such that, when the coincidence signal from the prefix data generating portion is received, the code length signal supplied from the prefix data generating portion is selected and supplied, and that, when the coincidence signal is not received, the code length signal supplied from the look-up table is selected and supplied, the pointer being so arranged as to receive the code length signal supplied from the code length selecting circuit, thereby to control the barrel shifter such that the variable-length code is shifted by the code length represented by the code length signal.

A variable-length decoding apparatus according to the present invention comprises:

a barrel shifter for shifting continuous variable-length codes by the predetermined number of bits;

a plurality of prefix data generating portions respectively disposed for the plurality of groups, except for the last-positioned group, into which each of a plurality of codes is divided, the prefix data generating portions previously containing (i) a plurality of predetermined patterns each having a predetermined code length comprising a plurality of bits and (ii) a plurality of bank addresses in each of which the number of bits is smaller than the code length of any of the predetermined patterns and which are respectively assigned to the predetermined patterns, the prefix data generating portions being arranged such that each variable-length code supplied from the barrel shifter is compared, from the head part thereof, with the plurality of predetermined patterns and that the bank addresses of the identical predetermined patterns are supplied; and a look-up table previously containing a large number of decoded data obtained by decoding a large number of variable-length codes, the look-up table being arranged such that, using, as an address, (i) the bank addresses respectively supplied by the prefix data generating portions and (ii) the remaining part of the variable-length code supplied from the barrel shifter, other than the identical predetermined patterns, there is supplied the decoded data corresponding to the variable-length code supplied from the barrel shifter.

Further, in the variable-length decoding apparatus according to the present invention, the look-up table is disposed within a single chip where the barrel shifter and the prefix data generating portion are mounted.

According to the variable-length decoding apparatus of the present invention, when a bit string having bits in predetermined number is supplied from the barrel shifter to the prefix data generating portion, the prefix data generating portion compares the bit string thus received, from the head part thereof, with a plurality of predetermined patterns. When the head part is identical with one of the predetermined patterns, there is supplied a bank address in which the number of bits is smaller than the code length of the identical predetermined pattern. In the look-up table, the corresponding decoded data is taken out using, as an address, (i) the bank address supplied from the prefix data generating portion and (ii) the remaining part of the bit string supplied from the barrel shifter, other than the plurality of bits (i.e., the predetermined pattern) substituted with the bank address. Accordingly, the look-up table can be addressed with an address in which the number of bits is smaller than that of the code. Therefore, a large number of decoded data can be stored in a smaller area, resulting in an increase in storage density of decoded data. This reduces the look-up table in hardware size. Thus, a small-capacity look-up table can be used.

Further, a bit string supplied from the barrel shifter is compared, from the head part thereof, with a plurality of predetermined patterns and supplied as a bank address. This reduces the time required for supplying the bank address, thereby to shorten the decoded-data addressing time, as compared with the arrangement where a bank address is supplied after repeatedly judging whether the bits of a bit string supplied from the barrel shifter are [1] or [0] one by one from the head of the bit string.

Further, according to the variable-length decoding apparatus of the present invention, when a bit string having bits in predetermined number is supplied from the barrel shifter and a plurality of head bits of the bit string are identical with a predetermined pattern, the prefix data generating portion supplies the bank address of the identical predetermined pattern, a coincidence signal and a signal representing the code length of the identical predetermined pattern. When the coincidence signal is supplied, the code length selecting circuit supplies, to the pointer, the code length signal from the prefix data generating portion. The pointer controls the barrel shifter such that the bit string is shifted by the code length represented by the code length signal thus received. Then, the barrel shifter shifts the bit string by the code length of the identical predetermined pattern.

Thereafter, the barrel shifter supplies the next bit string having bits in predetermined number. Located at the head part of this bit string is the remaining part of the previously supplied code, other than a plurality of bits thereof identical with the predetermined pattern. Using, as an address, (i) the bank address supplied from the prefix data generating portion and (ii) a plurality of remaining bits supplied from the barrel shifter, the decoded data is addressed in the look-up table.

Further, according to the variable-length decoding apparatus of the present invention, the prefix data generating portions are respectively disposed for the groups, except for the last-positioned group, into which each code is divided. When a bit string having bits in predetermined number is supplied from the barrel shifter, the prefix data generating portions supply bank addresses for the corresponding groups, except for the last-positioned group, into which a code contained in the bit string is divided. Using, as an address, (i) the respective bank addresses and (ii) the remaining part of the code other than the plurality of bits substituted with the respective bank addresses, the corresponding decoded data is addressed in the look-up table. Thus, the look-up table can be addressed with a bit string in which the number of bits is smaller than that of the code. This further reduces the look-up table in hardware size. A much smaller-capacity look-up table can therefore be employed.

Further, according to the variable-length decoding apparatus of the present invention, the look-up table is reduced in capacity. Therefore, the look-up table can be disposed in a chip where the barrel shifter and the prefix data generating portion are disposed. This shortens the wiring length toward the look-up table, thereby to shorten the time required for reading a decoded data from the look-up table. This results in an increase in decoded-data reading speed.

These and other features, objects and advantages of the present invention will be more fully apparent from the following detailed description set forth below when taken in conjunction with the accompanying drawings.

DESCRIPTION OF THE INVENTION

The following description will discuss preferred embodiments of the present invention with reference to attached drawings.

First Embodiment

Figure 4:
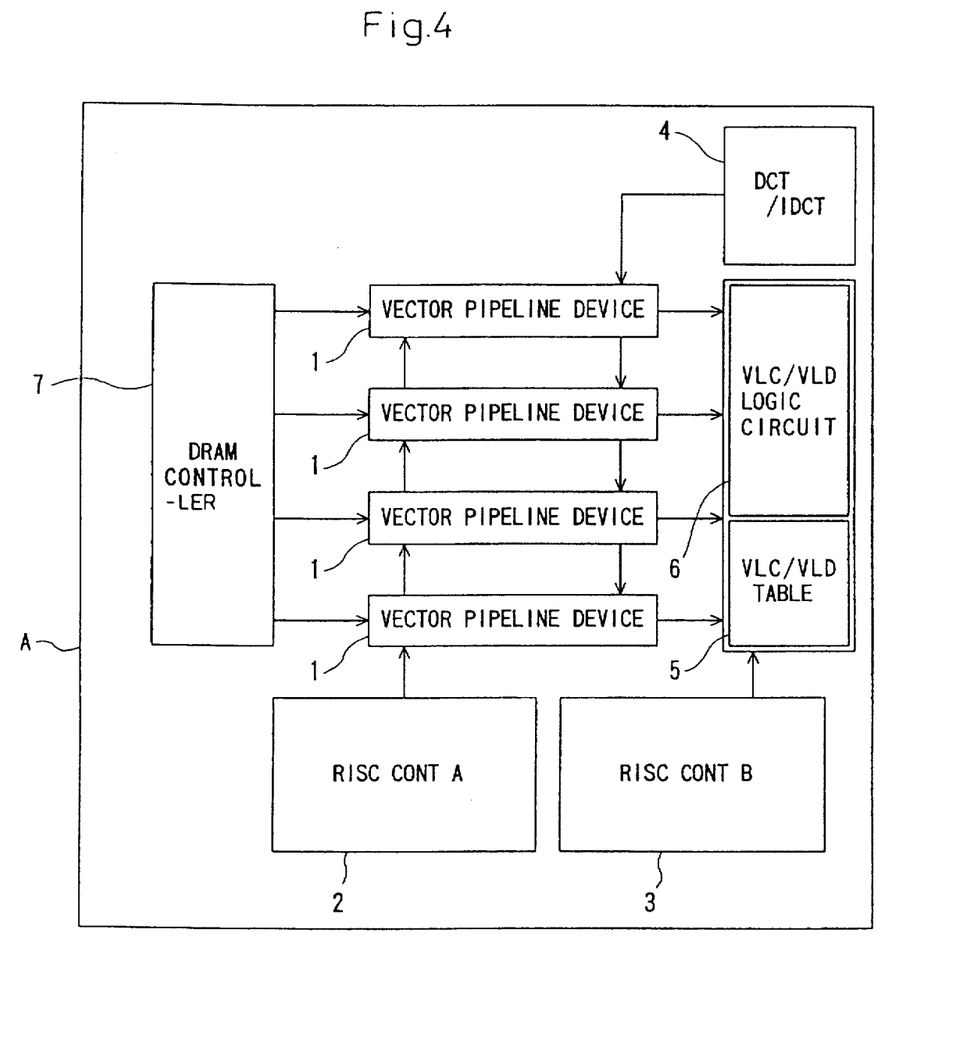
FIG. 4 is a view of the general arrangement of an image compression/extension LSI.

FIG. 4 shows the general arrangement of an image compression/extension LSI (A). Disposed on one chip in FIG. 4 are four vector pipeline devices 1 arranged mainly for motion compensation and quantization, a first control circuit RISCCONT.A (2) for controlling the image compression/ extension LSI (A) in its entirety according to the microcode, a second control circuit RISCCONT.B (3) arranged mainly for controlling variable-length coding (VLC) and variable-length decoding (VLD), a circuit 4 for effecting a discrete cosine transform (DCT) and an inverse discrete cosine transform (IDCT), a look-up table 5 which contains codes for variable-length coding and variable-length decoding, a circuit 6 for executing logic operations for variable-length coding and variable-length decoding, and a DRAM controller 7 for controlling an external DRAM.

In FIG. 4, the following operations will be made for coding an image signal. After the DRAM controller 7 fetches an image data into the inside thereof from the outside, the four vector pipeline devices 1 execute processing of motion compensation and quantization on the fetched image data, and the DCT/IDCT circuit 4 then executes a DCT processing on the image data. The operations above-mentioned are controlled by the first control circuit RISC-CONT.A (2). Then, using the VLC/VLD logic circuit 6 and the look-up table 5, the DCT-processed image data is subjected to variable-length coding. This variable-length coding operation is controlled by the second control circuit RISC-CONT.B (3).

The following operations will be made for decoding a coded image signal. After a coded image signal is fetched, the coded image data is subjected to variable-length decoding using the VLC/VLD logic circuit 6 and the look-up table 5. This variable-length decoding operation is controlled by the second control circuit RISCCONT.B (3). Then, the four vector pipeline devices 1 execute a processing of inverse quantization on the decoded image data, and the DCT/IDCT circuit 4 then executes an IDCT processing on the image data after subjected to inverse quantization. Then, the DRAM controller 7 writes, into an external DRAM, the image data after subjected to the IDCT processing. The three operations above-mentioned are controlled by the first control circuit RISCCONT.A (2).

Figure 1:
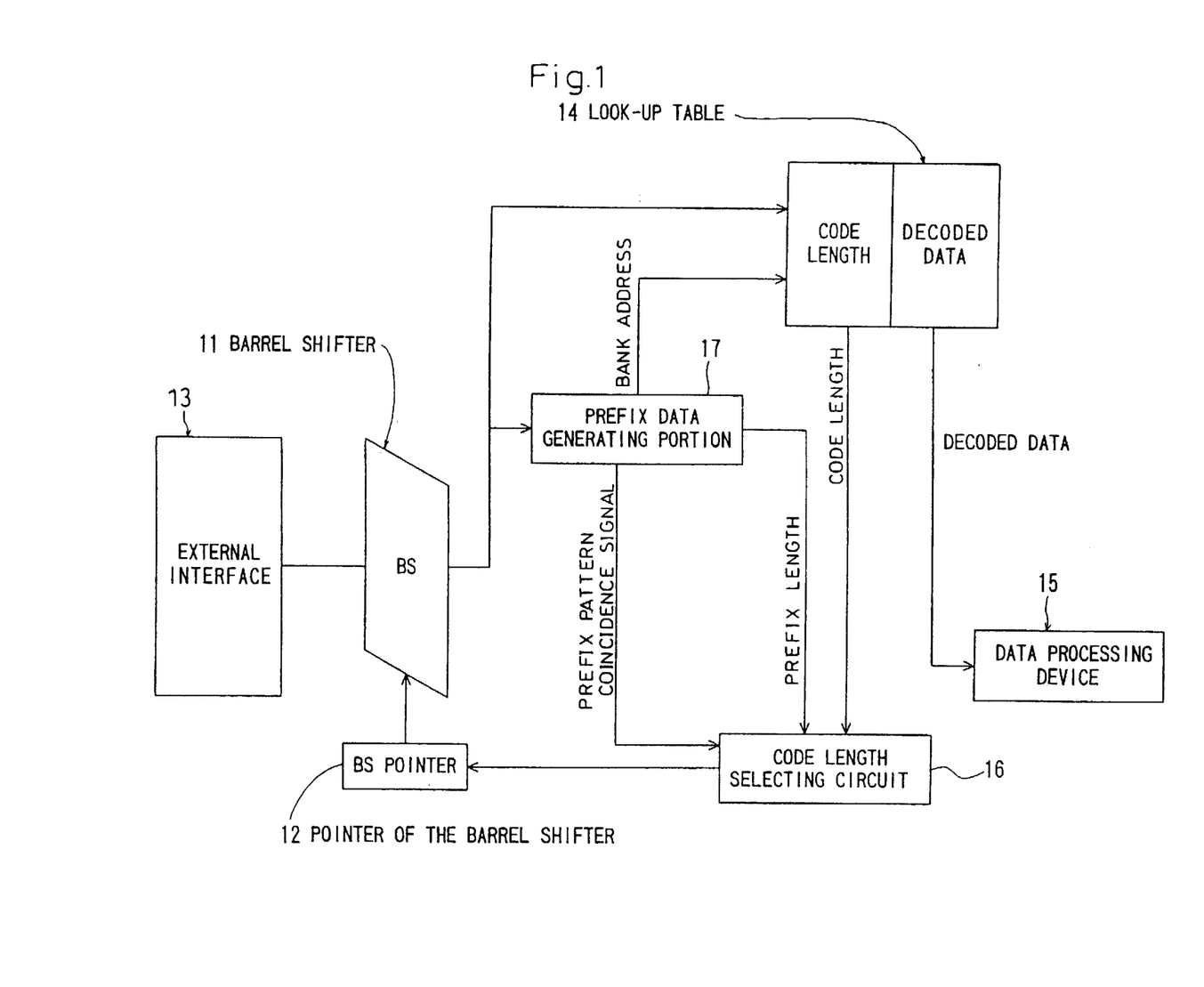
FIG. 1 is a block diagram of a variable-length decoding apparatus according to a first embodiment of the present invention.

FIG. 1 is a block diagram illustrating an arrangement serving as a variable-length decoding apparatus for effecting variable-length decoding, in the VLC/VLD logic circuit 6 in the image compression/extension LSI (A).

Shown in FIG. 1 are a barrel shifter 11 for shifting continuous variable-length codes by bits in predetermined number (for example, 10 bits), a pointer 12 for the barrel shifter 11 for designating the predetermined number of bits, for example 10 bits, to be shifted by the barrel shifter 11, an external interface 13 into which a code is externally entered, a look-up table (hereinafter referred to as LUT) 14 previously containing decoded data and the like, and a data processing device 15 for processing the decoded data taken out from the LUT 14.

The following description will discuss the characteristics portions of the present invention, i.e., a code length selecting circuit 16 and a prefix data generating portion 17.

Figure 2:
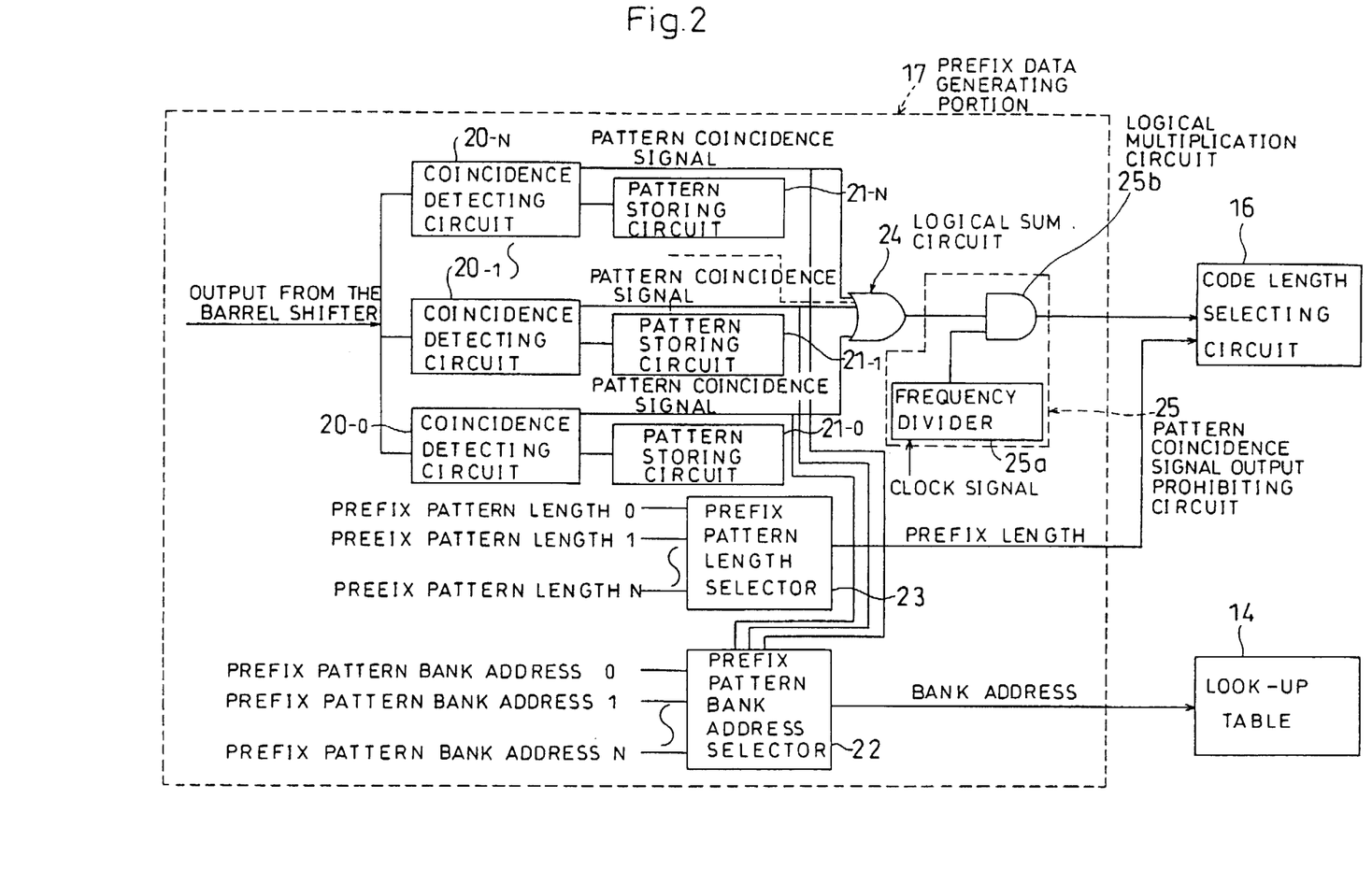
FIG. 2 is a block diagram of the prefix data generating portion in the variable-length decoding apparatus according to the first embodiment of the present invention.

FIG. 2 shows in detail the prefix data generating portion 17. In FIG. 2, there are disposed pattern storing circuits 21-0, 21-1–21-N. For codes shown in the first embodiment as an example in Table 1 (in which the maximum code length of the codes is 10 bits), these pattern storing circuits 21-0–21-N store prefix patterns (predetermined patterns) each comprising a plurality of bits shown in Table 2 (in which the number of the types of prefix patterns N is equal to 7) which are identical with a plurality of head bits of the codes above-mentioned.

TABLE 1

| Code | Code No. |
| --- | --- |
| 0100 | 1 |
| 0110 | 2 |
| 00100 | 3 |
| 00101 | 4 |
| 000100 | 5 |
| 000110 | 6 |
| 0000100 | 7 |
| 0000110 | 8 |
| 00000100 | 9 |
| 00000101 | 10 |
| 000000100 | 11 |
| 000000111 | 12 |
| 0000000111 | 13 |
| 0000000110 | 14 |
| 0000000010 | 15 |

TABLE 2

| Pattern No. | Prefix Pattern | Length (Code Length) | Bank Address |
| --- | --- | --- | --- |
| 0 | 01 | 2 | 0 |
| 1 | 001 | 3 | 1 |
| 2 | 0001 | 4 | 2 |
| 3 | 00001 | 5 | 3 |
| 4 | 000001 | 6 | 4 |
| 5 | 0000001 | 7 | 5 |
| 6 | 00000001 | 8 | 6 |
| 7 | 000000001 | 9 | 7 |

In Table 1, 15 code numbers (15 types of codes) are prepared and the maximum code length is set to 10 bits. In Standards for Image Processing MPEG2, however, about 390 code numbers are prepared and the maximum code length is around 17 bits.

In Table 2, the respective predetermined patterns have different code lengths. As a matter of fact, however, there are instances where a plurality of predetermined patterns have the same code length. It is therefore required to assign different bank addresses to such a plurality of predetermined patterns having the same code length.

Further, Table 1 shows, as examples, the codes in which a bit [1] follows one or a plurality of [0] and any of the 2-bit codes [00], [01], [10] follows thereafter. Accordingly, each of the prefix patterns in Table 2 contains one group comprising one or a plurality of [0] and one [1] which follows thereafter. More specifically, each of the codes in Table 1 comprises two groups, i.e., one group of any of the prefix patterns in Table 2 and the other group of any of the 2-bit codes. Actual prefix patterns include a variety of patterns in which [0] and [1] are combined in a complicated manner as shown in Table 3.

TABLE 3

| Pattern No. | Prefix Pattern | Length (Code Length) | Bank Address |
| --- | --- | --- | --- |
| 8 | 0110 | 4 | 8 |
| 9 | 1101011 | 7 | 9 |
| 10 | 10111001 | 8 | 10 |

In FIG. 2, coincidence detecting circuits 20-0, 20-1~20-N have the functions of comparing, from the head, a bit string having bits in predetermined number supplied from the barrel shifter 11 in FIG. 1, with the prefix patterns stored in the pattern storing circuits 21-0~21-N, of checking whether or not the bit string having bits in predetermined number is identical with any of the prefix patterns, and of supplying, in the affirmative, a pattern coincidence signal k corresponding to the identical prefix pattern k (k=any of 1, 2, . . . N).

In FIG. 2, a prefix pattern bank address selector (bank address supplying means) 22 previously contains bank addresses 0~N (N=7) assigned correspondingly to the prefix patterns 0~N (N=7), respectively, as shown in Table 2, and selects and supplies the bank address k of the prefix pattern k corresponding to the pattern coincidence signal k supplied from one of the coincidence detecting circuits 20-0~20-N. In each of the bank addresses 0~N, the number of bits is less than the code length of each of the corresponding prefix patterns 0~N. The bank address supplied from the prefix pattern bank address selector 22 is entered into the LUT 14 in FIG. 1.

A prefix pattern length selector (code length signal supplying means) 23 previously contains the lengths (code lengths) of the prefix patterns 0~N as shown in Table 2, and is arranged such that, upon reception of the pattern coincidence signal k supplied from one of the coincidence detecting circuits 20-0~20-N, the prefix pattern length selector 23 selects the length (code length) k of the prefix pattern k corresponding to the pattern coincidence signal k and supplies a code length signal.

Figure 3:
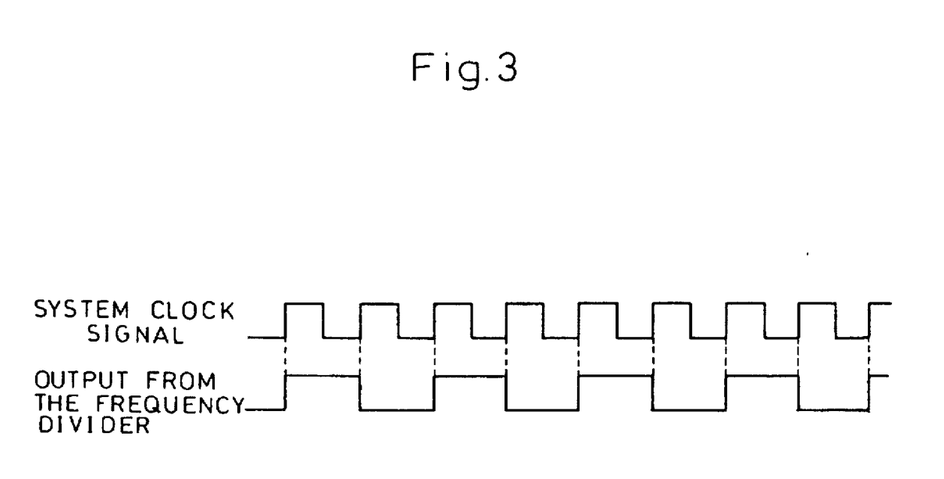
FIG. 3 is a view illustrating the operation of the frequency divider in the first embodiment.

There are also disposed a logical sum circuit 24 for operating the logical sum of the pattern coincidence signals 0~N of the coincidence detecting circuits 20-0 ~20-N, and a pattern coincidence signal output prohibiting circuit 25 for prohibiting the pattern coincidence signal k having passed through the logical sum circuit 24 from being externally supplied on every other signal k. The pattern coincidence signal output prohibiting circuit 25 comprises (i) a frequency divider 25a for dividing, by two, the frequency of a system clock signal (clock signal) as shown in FIG. 3, and (ii) a logical multiplication circuit 25b for receiving the output of the frequency divider 25a and the output of the logical sum circuit 24.

In FIG. 1, the LUT 14 previously contains a large number of decoded data obtained by decoding a large number of variable-length codes. In order to supply the decoded data corresponding to a code supplied from the barrel shifter 11, each of these decoded data is stored in the form corresponding to (i) a bank address k supplied from the prefix pattern length selector 23 of the prefix data generating portion 17 and (ii) a plurality of remaining bits of a code supplied from the barrel shifter 11, other than the prefix pattern k corresponding to the bank address k. There are to be entered, into the LUT 14, (i) the bank address k supplied from the prefix pattern length selector 23 of the prefix data generating portion 17 and (ii) a bit string supplied form the barrel shifter 11. Provision is made such that, when the bank address k and a plurality of remaining bits are entered into the LUT 14, the decoded data is addressed with both the bank address k and the remaining bits serving as an address, and the LUT 14 supplies a code length signal representing the code length of the plurality of remaining bits of the code other than the bit string identical with any of the prefix patterns as shown in FIG. 1.

When the code length selecting circuit 16 in FIG. 1 has received a prefix pattern coincidence signal having passed through the pattern coincidence signal output prohibiting circuit 25 of the prefix data generating portion 17, the code length selecting circuit 16 selects and supplies the prefix length (the code length of the identical prefix pattern k) supplied from the prefix data generating portion 17. When the code length selecting circuit 16 does not receive the prefix pattern coincidence signal, the code length selecting circuit 16 selects and supplies a code length signal which represents the code length of a plurality of remaining bits of the code and which is supplied from the LUT 14.

The following description will discuss the operation of the variable-length decoding apparatus of the first embodiment.

A bit string is entered into the barrel shifter 11 from the external interface 13, and the barrel shifter 11 supplies, out of the bit string thus entered, a bit string having bits in predetermined number (10 bits). This bit string thus supplied is entered into the prefix data generating portion 17 in FIG. 2.

It is now supposed that the output of the barrel shifter 11 is [00101xxxxx] (in which [xxxxx] refers to a bit string having arbitrary five bits following on ([001 01]). The head part of this output becomes identical with the pattern 1 in Table 2. This causes the pattern coincidence signal 1 from the coincidence detecting circuits 20-1 to be enabled. Then, the pattern coincidence signal 1 is supplied through the logical sum circuit 24 and the pattern coincidence signal output prohibiting circuit 25.

Simultaneously with the output of the pattern coincidence signal 1, the prefix pattern length selector 23 supplies the prefix length 3 and the prefix pattern bank address selector 22 supplies the prefix pattern bank address 1.

Since the pattern coincidence signal 1 is enabled, the code length selecting circuit 16 selects and supplies the prefix length 3. This prefix length 3 is entered into the pointer 12. The pointer 12 causes the barrel shifter 11 to shift, from the head of the bit string, the bits of the bit string by the prefix length 3. Accordingly, there are located, at the head of a bit string having bits in predetermined number (10 bits) to be supplied at the next time from the barrel shifter 11, the remaining bits [01]of the code [00101] other than the prefix pattern [01]. More specifically, the barrel shifter 11 will supply, at the next time, a bit string [01xxxxxxx].

In the LUT 14, the decoded data is addressed with the prefix pattern bank address [001] serving as an upper address and the head two bits [01] of the bit string supplied from the barrel shifter 11.

As a result, the LUT 14 supplies the decoded data to the data processing device 15, which executes an image-data processing and other processing than the image-data processing.

Thus, the first embodiment is arranged such that the maximum value of bank addresses is 7 (i.e., 3 bits) and the maximum code length of the code with the prefix pattern excluded is 2 bits. This enables the corresponding decoded data to be addressed with the total 5 bits.

The prefix of the output [01xxxxxxx] of the barrel shifter 11 is identical with the prefix pattern of the pattern number 0 in Table 2, but the logical multiplication circuit 25b of the pattern coincidence signal output prohibiting circuit 25 in FIG. 2 prevents the pattern coincidence signal 0 from being supplied. As mentioned earlier, the LUT 14 contains (i) the decoded data obtained by subjecting codes to variable-length decoding and (ii) the code lengths of the remaining parts of the codes with the prefix patterns excluded. Accordingly, the LUT 14 supplies a signal representing the code length of the remaining part of the code with the prefix pattern excluded. Since no pattern coincidence signal is supplied from the prefix data generating portion 17, the code length selecting circuit 16 selects and supplies the code length signal supplied from the LUT 14.

The code length signal supplied from the code length selecting circuit 16 is entered into the pointer 12 for the barrel shifter 11. Accordingly, the barrel shifter 11 shifts the head two bits of the bit string. Thus, the next code following the previous code [00101] is located at the head of a bit string to be supplied at the next time by the barrel shifter 11.

Figure 5:
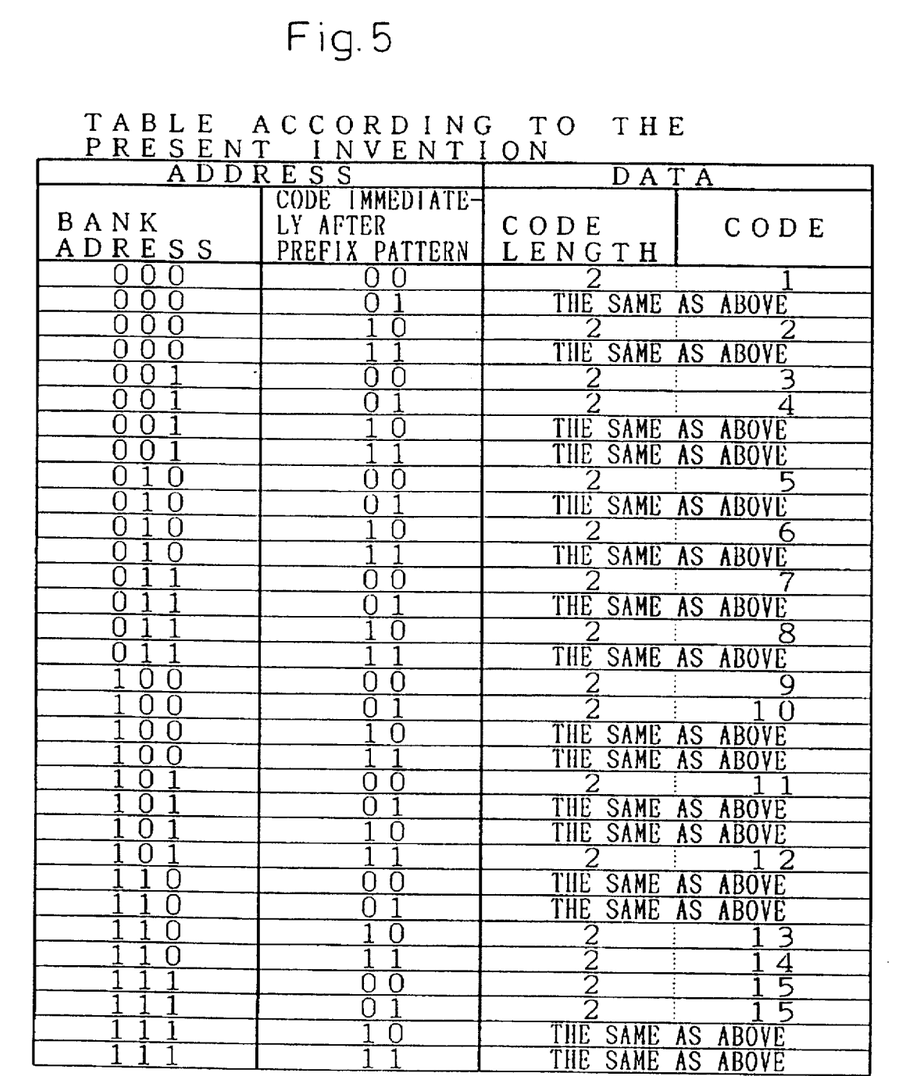
FIG. 5 shows the look-up table in the first embodiment of the present invention.

Thus, the first embodiment is arranged such that the head part of a code is replaced with a shorter-length bank address and the LUT 14 can be addressed using, as an address, (i) this bank address and (ii) the remaining part of the code with the head part excluded therefrom. More specifically, when the code length is 10 bits, there is conventionally required a look-up table of $2^{10}$ words as shown in FIG. 6. On the other hand, the first embodiment is so arranged as to effect addressing with a 5-bit address. Accordingly, as shown in FIG. 5, the look-up table in this embodiment can store decoded data in the same amount with higher storage density as compared with the look-up table of prior art. Thus, the LUT can be formed in smaller capacity of $2^5$ words and therefore disposed on one chip in the image compression/extension LSI (A).

Second Embodiment

Figure 7:
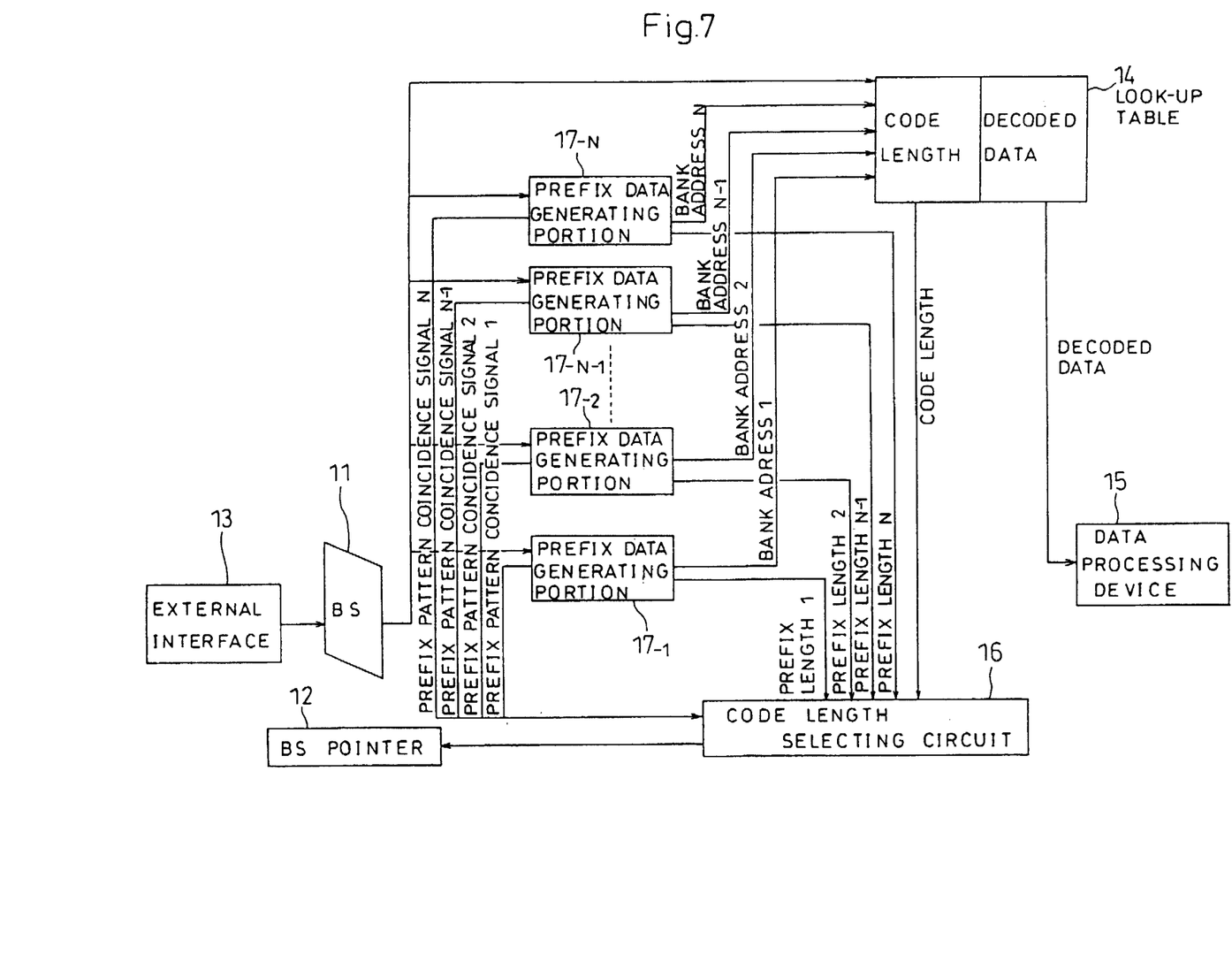
FIG. 7 is a block diagram of a variable-length decoding apparatus according to a second embodiment of the present invention.

FIG. 7 shows a second embodiment of the present invention.

In the second embodiment, a decoded data is addressed with each code divided into a plurality of groups not less than three groups, instead of two groups into which each code is divided in the first embodiment.

More specifically, the variable-length decoding apparatus in FIG. 7 is similar to the apparatus shown in FIG. 1 except that the prefix data generating portion 17 in the first embodiment in FIG. 1 is disposed in the plural number in the second embodiment.

As shown in FIG. 7, each of a plurality of prefix data generating portions 17-1, 17-2 . . . 17-N-1, 17-N is so arranged as to supply a bank address generated thereby to a LUT 14 and also to supply both a prefix length and a prefix pattern coincidence signal generated thereby to a code length selecting circuit 16.

The number of the prefix data generating portions 17-1, 17-2 . . . 17-N-1, 17-N is two when each code is divided into three groups, and three when each code is divided into four groups. Generally, (N–1) prefix data generating portions are disposed when each code is divided into N groups.

Figure 8A:
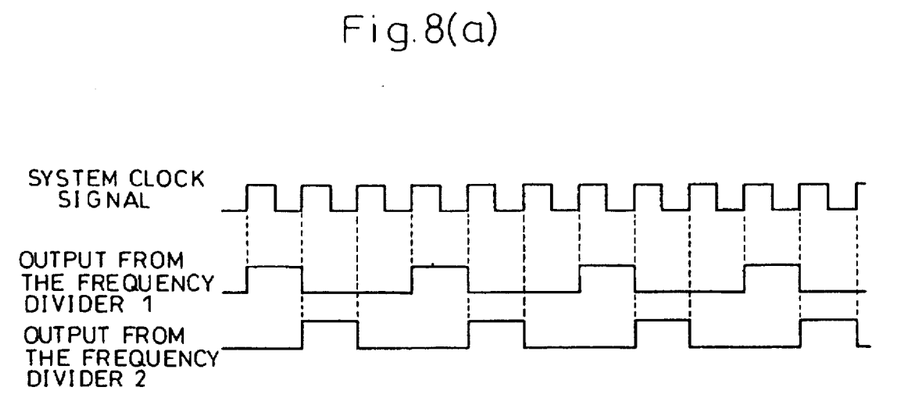
FIG. 8(a) is a view illustrating the operations of the two frequency dividers disposed at the two prefix data generating portions in the second embodiment.
Figure 8B:
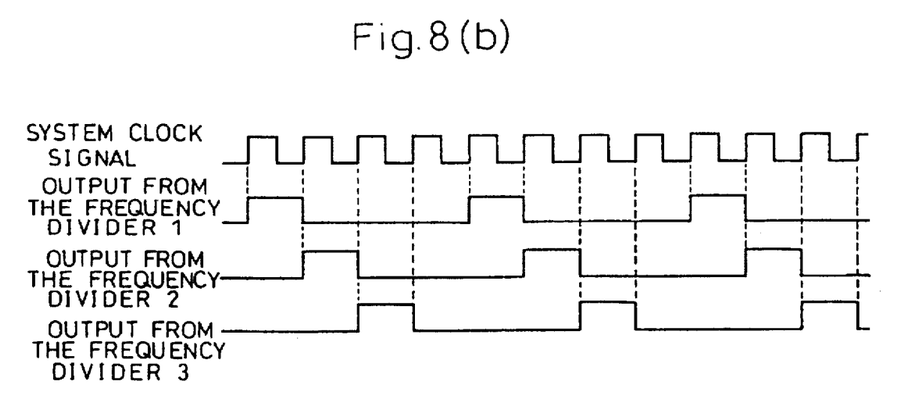
FIG. 8(b) is a view illustrating the operations of the three frequency dividers disposed at the three prefix data generating portions in the second embodiment.

Likewise the pattern coincidence signal output prohibiting circuit 25 in FIG. 2 in the first embodiment, each of the prefix data generating portions 17-1, 17-2 . . . 17-N-1, 17-N has a frequency divider (not shown) for dividing the frequency of a system clock signal. The frequency of a system clock signal is divided by three as shown in FIG. 8(a) when two prefix data generating portions are disposed, and the frequency of a system clock signal is divided by four as shown in FIG. 8(b) when three prefix data generating portions are disposed. Generally, provision is made such that the frequency of the system clock signal is divided by (N+1) for N prefix data generating portions.

As understood from FIG. 8(a) and (b), the outputs of the frequency dividers are shifted from one another by one period of the system clock signal.

In FIG. 7, the LUT 14 is arranged such that, after the LUT 14 has received bank addresses from all the prefix data generating portions 17-1 . . . 17-N, there is supplied the decoded data of a code, at the final period (at the third clock when the frequency dividers divide the frequency of the system clock signal by three, or at the fourth clock when the frequency dividers divide the frequency of the system clock signal by four), using as an address (i) these bank addresses and (ii) a plurality of remaining bits of the code other than the parts identical with respective prefix patterns.

Thus, according to the second embodiment, since each code is divided into N (N≧3) groups, a decoded data can be addressed in the LUT 14 using (N–1) bank addresses and a plurality of bits forming the remaining one group. As compared with the first embodiment in which each code is divided into two groups, the LUT 14 can further be reduced in circuit size.

We claim:

1. A variable-length decoding apparatus comprising:

a barrel shifter for shifting continuous variable-length codes by a predetermined number of bits;

a prefix data generating portion previously containing (i) a plurality of predetermined patterns each having a predetermined code length comprising a plurality of bits and (ii) a plurality of bank addresses in each of which the number of bits is smaller than the code length of any of said predetermined patterns and which are respectively assigned to said predetermined patterns;

said prefix data generating portion being arranged such that each variable-length code supplied from said barrel shifter is compared, from the head part thereof, with said plurality of predetermined patterns and that one of the bank addresses that corresponds to the identical predetermined pattern is supplied;

a look-up table previously containing a large number of decoded data obtained by decoding a large number of variable-length codes; and said look-up table being arranged such that, using, as an address, (i) said address supplied by said prefix data generating portion and (ii) the remaining part of said variable-length code supplied from said barrel shifter, other than said predetermined pattern, there is supplied the decoded data corresponding to said variable-length code supplied from said barrel shifter.

2. A variable-length decoding apparatus according to claim 1, further comprising:

a pointer for instructing, to said barrel shifter, the predetermined number of bits to be shifted; and a code length selecting circuit;

said prefix data generating portion being so arranged as to generate a coincidence signal representing that the head part of a code including bits in predetermined number, is identical with a predetermined pattern, and as to supply a code length signal representing the code length of said identical predetermined pattern, said look-up table being so arranged as to supply a signal representing the code length obtained by subtracting said code length of said identical predetermined pattern, from the code length of a variable-length code to be decoded, said code length selecting circuit being arranged such that, when said coincidence signal from said prefix data generating portion is received, said code length signal supplied from said prefix data generating portion is selected and supplied, and that, when said coincidence signal is not received, said code length signal supplied from said look-up table is selected and supplied, said pointer being so arranged as to receive said code length signal supplied from said code length selecting circuit, thereby to control said barrel shifter such that said variable-length code is shifted by the code length represented by said code length signal.

3. A variable-length decoding apparatus according to any of claims 1 and 2, wherein said prefix data generating portion comprises:

a plurality of pattern storing circuits previously containing a plurality of predetermined patterns, respectively;

a coincidence detecting circuit arranged such that a variable-length code supplied from said barrel shifter is compared, from the head part thereof, with said plurality of predetermined patterns in said pattern storing circuits and that said coincidence detecting circuit supplies a pattern coincidence signal corresponding to said identical predetermined pattern; and bank address supplying means previously containing a plurality of bank addresses, and arranged such that, upon reception of said pattern coincidence signal from said coincidence detecting circuit, said bank address supplying means supplies the bank address of the pattern corresponding to said received pattern coincidence signal.

4. A variable-length decoding apparatus according to claim 3, wherein said coincidence detecting circuit is disposed in the plural number identical with that of said plurality of pattern storing circuits, said coincidence detecting circuits being so arranged as to compare a variable-length code supplied from said barrel shifter, with the predetermined patterns stored in the corresponding pattern storing circuits.

5. A variable-length decoding apparatus according to claim 3, wherein said prefix data generating portion has code length signal supplying means so arranged as to receive said pattern coincidence signal from said coincidence detecting circuit, thereby to supply a code length signal of the predetermined pattern corresponding to said received pattern coincidence signal.

6. A variable-length decoding apparatus according to claim 3, wherein said prefix data generating portion comprises a coincidence signal output prohibiting circuit for prohibiting said pattern coincidence signal of said coincidence detecting circuit from being externally supplied on every other pattern coincidence, and said pattern coincidence signal having passed through said coincidence signal output prohibiting circuit, is supplied to said code length selecting circuit and said pattern coincidence signal before passing through said coincidence signal output prohibiting circuit, is supplied to said bank address supplying means.

7. A variable-length decoding apparatus according to claim 6, wherein said coincidence signal output prohibiting circuit comprises:

a frequency divider for dividing the frequency of a clock signal by two; and a logical multiplication circuit for receiving said pattern coincidence signal of said coincidence detecting circuit and the output of said frequency divider.

8. A variable-length decoding apparatus comprising:

a barrel shifter for shifting continuous variable-length codes by a predetermined number of bits;

a plurality of prefix data generating portions respectively disposed for the plurality of groups, except for the last-positioned group, into which each of a plurality of codes is divided;

said prefix data generating portions previously containing (i) a plurality of predetermined patterns each having a predetermined code length comprising a plurality of bits and (ii) a plurality of bank addresses in each of which the number of bits is smaller than the code length of any said predetermined patterns and which are respectively assigned to said predetermined patterns;

said prefix data generating portions being arranged such that each variable-length code supplied from said barrel shifter is compared, from the head part thereof, with said plurality of predetermined patterns and that one of the bank addresses that corresponds to the identical predetermined patterns are supplied;

a look-up table previously containing a large number of decoded data obtained by decoding a large number of variable-length codes; and said look-up table being arranged such that, using as an address, (i) said bank addresses respectively supplied by said prefix data generating portions and (ii) the remaining part of said variable-length code supplied from said barrel shifter, other than said identical predetermined patterns, there is supplied the decoded data corresponding to said variable-length code supplied from said barrel shifter.

9. A variable-length decoding apparatus according to claim 8, further comprising:

a pointer for instructing, to said barrel shifter, the predetermined number of bits to be shifted; and a code length selecting circuit;

said prefix data generating portions being so arranged as to generate coincidence signals representing that the head part of a code including bits in predetermined number, is identical with predetermined patterns, and as to supply code length signals representing the code lengths of said identical predetermined patterns, said look-up table being so arranged as to supply a signal representing the code length obtained by subtracting the total sum of the code lengths of said identical predetermined patterns, from the code length of a variable-length code to be decoded, said code length selecting circuit being arranged such that, when said coincidence signals from said prefix data generating portions are received, said code length signals supplied from said prefix data generating portions are selected and supplied, and that, when said coincidence signals are not received, said code length signal supplied from said look-up table is selected and supplied, said pointer being so arranged as to receive said code length signal supplied from said code length selecting circuit, thereby to control said barrel shifter such that said variable-length code is shifted by the code length represented by said code length signal.

10. A variable-length decoding apparatus according to any of claims 8 and 9, wherein each of said prefix data generating portions comprises:

a plurality of pattern storing circuits previously respectively containing a plurality of predetermined patterns for the corresponding group;

a coincidence detecting circuit arranged such that a variable-length code supplied from said barrel shifter is compared, from the head part thereof, with said plurality of predetermined patterns stored in said pattern storing circuits and that said coincidence detecting circuit supplies a pattern coincidence signal corresponding to the identical predetermined pattern; and bank address supplying means previously containing a plurality of bank addresses, and arranged such that, upon reception of said pattern coincidence signal from said coincidence detecting circuit, said bank address supplying means supplies the bank address of the pattern corresponding to said received pattern coincidence signal.

11. A variable-length decoding apparatus according to claim 10, wherein in each of said prefix data generating portions, said coincidence detecting circuit is disposed in the plural number identical with that of said plurality of pattern storing circuits, said coincidence detecting circuits being so arranged as to compare a variable-length code supplied from said barrel shifter, with said predetermined patterns stored in the corresponding pattern storing circuits.

12. A variable-length decoding apparatus according to claim 10, wherein each of said prefix data generating portions has code length signal supplying means so arranged as to receive said pattern coincidence signal from said coincidence detecting circuit, thereby to supply a code length signal of the predetermined pattern corresponding to said received pattern coincidence signal.

13. A variable-length decoding apparatus according to claim 10, wherein each of said prefix data generating portions comprises a coincidence signal output prohibiting circuit for allowing the external output of said pattern coincidence signal from said coincidence detecting circuit at a ratio of one to the number of said groups into which each code is divided, with other outputs of said pattern coincidence signal prohibited, and said pattern coincidence signal having passed through said coincidence signal output prohibiting circuit, is supplied to said code length selecting circuit and said pattern coincidence signal before passing through said coincidence signal output prohibiting circuit, is supplied to said bank address supplying means.

14. A variable-length decoding apparatus according to claim 13, wherein said coincidence signal output prohibiting circuit in each of said prefix data generating portions comprises:

a frequency divider for dividing the frequency of a clock signal by an integer in which 1 is added to the number of said prefix data generating portions; and a logical multiplication circuit for receiving said pattern coincidence signal of said coincidence detecting circuit and the output of said frequency divider, the outputs of logical multiplications of said prefix data generating portions are shifted from one another by one period of said clock signal.

15. A variable-length decoding apparatus according to any of claims 1 and 2, wherein said look-up table is disposed within a single chip where said barrel shifter and said prefix data generating portion are mounted.

* * * * *